US00RE41583E

(19) United States
(12) Reissued Patent
Doetsch et al.

(10) Patent Number: US RE41,583 E
(45) Date of Reissued Patent: Aug. 24, 2010

(54) FREQUENCY-STABILIZED TRANSCEIVER CONFIGURATION

(75) Inventors: Markus Doetsch, Niederscherli (CH); Peter Jung, Otterberg (DE); Joerg Plechinger, Munich (DE); Peter Schmidt, Ellerstadt (DE)

(73) Assignee: Infineon Technologies AG, Neubiberg (DE)

(21) Appl. No.: 11/657,379

(22) Filed: Jan. 24, 2007

Related U.S. Patent Documents

Reissue of:
(64) Patent No.: 6,847,812
Issued: Jan. 25, 2005
Appl. No.: 09/840,551
Filed: Apr. 23, 2001

U.S. Applications:

(63) Continuation of application No. PCT/DE99/03274, filed on Oct. 12, 1999, now Pat. No. 6,847,812.

(51) Int. Cl.
*H04B 1/26* (2006.01)
*H04B 15/00* (2006.01)
*H04B 1/38* (2006.01)
*H04B 5/16* (2006.01)

(52) U.S. Cl. ..... 455/316; 455/85; 455/147; 455/196.1; 455/209; 375/223; 375/219; 375/222; 375/340

(58) Field of Classification Search ..... 455/316, 455/85, 147, 196.1, 209, 323, 324; 375/222, 375/223, 219, 340
See application file for complete search history.

(56) References Cited

U.S. PATENT DOCUMENTS 4,952,883 A 8/1990 Enomoto et al.
5,267,260 A 11/1993 Lee
5,271,039 A 12/1993 Suzuki
5,278,865 A 1/1994 Amrany et al.
5,283,811 A 2/1994 Chennakeshu et al.

(Continued)

FOREIGN PATENT DOCUMENTS

| | | |
|---|---|---|
| DE | 41 43 197 | 11/1992 |
| DE | 42 44 136 | 7/1993 |
| DE | 197 13 102 | 11/1997 |
| EP | 0 825 742 | 2/1996 |
| EP | 0 757 446 | 2/1997 |
| EP | 0 757 483 | 3/1999 |
| GB | 2 304 243 | 3/1997 |
| JP | 1065605 | 3/1989 |
| JP | 04065912 | 3/1992 |
| JP | 9191253 | 7/1997 |
| JP | 10257112 | 9/1998 |
| JP | 11513787 | 11/1999 |
| WO | WO 00/25419 | 10/1998 |
| WO | WO 99/26336 | 5/1999 |

OTHER PUBLICATIONS

"Completely Integrated 1.5 Ghz Direct Conversion transceiver", 1984 Symposium on VLSI Circuits Digest of technical papers, pp. 135–137, XP 00501059.*

Peter Weger et al.: "Completely Integrated 1.5 GHz Direct Conversion Transceiver" 1994 Symposium on VLSI Circuits Digest of technical Papers, pp. 135–137,XP000501059.

*Primary Examiner*—Huy Q Phan

(57) ABSTRACT

A transceiver configuration has an integrated circuit (IC) with an A/D and/or D/A converter, a VCO with a reference oscillator, which provides a sampling clock for the A/D and/or D/A converter, and a digital data processing circuit. The IC is connected to a radio-frequency section, the frequency converter stage of which is operated with a beat frequency derived from the controllable oscillator frequency $f_{oz}$. A capacitive resonant element of the reference oscillator is disposed outside of the IC.

29 Claims, 1 Drawing Sheet

U.S. PATENT DOCUMENTS 5,301,364 A 4/1994 Arens et al.
5,361,276 A 11/1994 Subramanian
5,397,335 A 3/1995 Gresl et al.
5,416,524 A * 5/1995 Citta et al. ..... 348/471
5,430,890 A 7/1995 Vogt et al.
5,475,374 A * 12/1995 Moore ..... 340/825.22
5,510,845 A 4/1996 Yang et al.
5,535,432 A 7/1996 Dent
5,594,612 A 1/1997 Henrion
5,617,236 A * 4/1997 Wang et al. ..... 398/117
5,663,734 A 9/1997 Krasner
5,732,109 A 3/1998 Takahashi
5,764,693 A 6/1998 Taylor et al.
5,783,974 A 7/1998 Koslov et al.
5,790,614 A 8/1998 Powell
5,844,435 A * 12/1998 Grundvig ..... 327/151
5,937,335 A * 8/1999 Park et al. ..... 455/86
5,950,112 A 9/1999 Hori et al.
6,005,506 A 12/1999 Bazarjani et al.
6,021,110 A 2/2000 McGibney
6,061,704 A 5/2000 Ostman et al.
6,088,406 A 7/2000 Suzuki
6,154,640 A 11/2000 Itoh et al.
6,307,480 B1 * 10/2001 Sheldon et al. ..... 340/636.1
6,307,891 B1 * 10/2001 Hein et al. ..... 375/285
6,307,896 B1 10/2001 Gumm et al.
6,370,188 B1 4/2002 Wu et al.
6,535,561 B2 3/2003 Boesch et al.
6,643,321 B1 11/2003 Genossar et al.

* cited by examiner

FREQUENCY-STABILIZED TRANSCEIVER CONFIGURATION

Matter enclosed in heavy brackets [ ] appears in the original patent but forms no part of this reissue specification; matter printed in italics indicates the additions made by reissue.

CROSS-REFERENCE TO RELATED APPLICATION

This application is a continuation of copending International Application No. PCT/DE 99/03274, filed Oct. 12, 1999, which designated the United States.

BACKGROUND OF THE INVENTION

Field of the Invention

The invention relates to a frequency-stabilized transceiver configuration which is intended to be used in communication terminals for wire-connected and/or wireless communication. The transceiver configuration has an A/D converter outputting a first digital data signal, a D/A converter, and a controllable oscillator circuit. The controllable oscillator circuit has a reference oscillator with an oscillating crystal as a resonator and outputs a sampling clock received by the A/D converter and the D/A converter. A digital data processing circuit receives the first digital data signal output by the A/D converter and processes, it further and outputs a second digital data signal to the D/A converter. A frequency section being a radio-frequency and/or an intermediate-frequency section is provided and has a frequency converter stage operated with a beat frequency derived from the controllable oscillator circuit.

Such transceiver configurations are known and described, for example, in the article titled "Radio Frequency Integrated Circuit Technology for Low-Power Wireless Communications", L. E. Larson, IEEE Personal Communications, Pages 11–19, June 1998.

A central variable in the transmission of messages is the bandwidth available for transmission since it limits the maximum achievable number of messages which can be transmitted per unit time when a minimum transmission quality is stipulated. As a rule, the available bandwidth is limited. Apart from software approaches to the bandwidth problem which are also based on stipulating a suitable data structure, the best-possible utilization of the available bandwidth must also always be ensured on the hardware side.

In the field of mobile radios, for example, the available total bandwidth is divided into traffic channels with predetermined channel bandwidths, a certain traffic channel being assigned to a subscriber when he accesses the mobile radio network. The radio-frequency section of the communication terminal is set to the assigned channel frequency by the frequency converter stage and any bandwidth limiting of the signal received or to be transmitted, which is required for avoiding inter-channel cross-talk, is usually implemented is the intermediate-frequency, low-frequency or baseband region by filtering out signal components not needed by appropriate analog or digital bandpass or low pass filters.

To obtain the best-possible utilization of the channel bandwidth, it must be possible to adjust the frequency converter stage to the required channel frequency with high accuracy and stability with time. For this purpose, the oscillator circuit operating the frequency converter stage must have high frequency stability.

To achieve high frequency stabilities of the oscillator circuit, it is already known from the article mentioned initially for either the entire oscillator circuit or only the reference oscillator to be an external hybrid component. The disadvantage of these solutions is the relatively high cost entailed when using hybrid components.

An alternative solution also described in the article mentioned consists in providing a completely integrated implementation of the oscillator circuit. However, a completely integrated oscillator circuit exhibits too little frequency stability for many applications.

In the article titled "QPSK and BPSK Demodulator Chip Set for Satellite Applications" by R. van der Wal, IEEE Transactions on Consumer Electronics, US, Vol. 41, No. 1, pages 30 to 41 (1995), a controller QDMC for a quadrature demodulator is described which is implemented in the form of a chip. The controller exhibits two A/D converters for the I and Q signal branch and also contains a voltage controlled oscillator (VCO). The phase lock loop (PLL) control loop of the VCO contains an operational amplifier operated in a negative feedback circuit, the output of which is supplied to an oscillating crystal used as a resonator. The oscillating crystal and the negative feedback circuit of the operational amplifier (series circuit formed of a resistor and a capacitor) are constructed as external components which are not integrated in the chip.

SUMMARY OF THE INVENTION

With the foregoing and other objects in view there is provided, in accordance with the invention, a transceiver configuration for a communication terminal. The transceiver configuration contains an A/D converter outputting a first digital data signal, a D/A converter and a controllable oscillator circuit connected to the A/D converter and to the D/A converter. The controllable oscillator circuit has a reference oscillator with an oscillating crystal as a resonator and outputs a sampling clock received by the A/D converter and the D/A converter. A digital data processing circuit is connected to the A/D converter and to the D/A converter and receives the first digital data signal output by the A/D converter and processes it further and outputs a second digital data signal to the D/A converter. The A/D converter, the D/A converter, the data processing circuit and the controllable oscillator circuit, apart from the oscillating crystal of the reference oscillator, are constructed as a monolithically integrated circuit so that of the controllable oscillator circuit, only the oscillating crystal is implemented as an external component. A frequency section being a radio-frequency section and/or an intermediate-frequency section is connected to the A/D converter, to the D/A converter and to the controllable oscillator circuit. The frequency section has a frequency converter stage operating with a beat frequency derived from the controllable oscillator circuit.

Due to the integration of the oscillator circuit into the integrated circuit, which is complete apart from the oscillating crystal, a high overall degree of integration of the circuit configuration according to the invention is achieved as a result of which its production costs can be kept down. Due to the external configuration ("dislocation") of the oscillating crystal with respect to the integrated circuit, it is still possible to guarantee high frequency stability.

An especially high degree of integration of the circuit configuration according to the invention, which is advantageous from the point of view of costs, is achieved if the integrated circuit contains other elements such as a digital filter, a channel estimator or a data detector.

In accordance with an added feature of the invention, the digital data processing circuit has a digital filter and a digital modulator.

In accordance with another feature of the invention, the digital data processing circuit has a channel estimator.

In accordance with a concomitant feature of the invention, a data detector is connected to the channel estimator.

Other features which are considered as characteristic for the invention are set forth in the appended claims.

Although the invention is illustrated and described herein as embodied in a frequency-stabilized transceiver configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
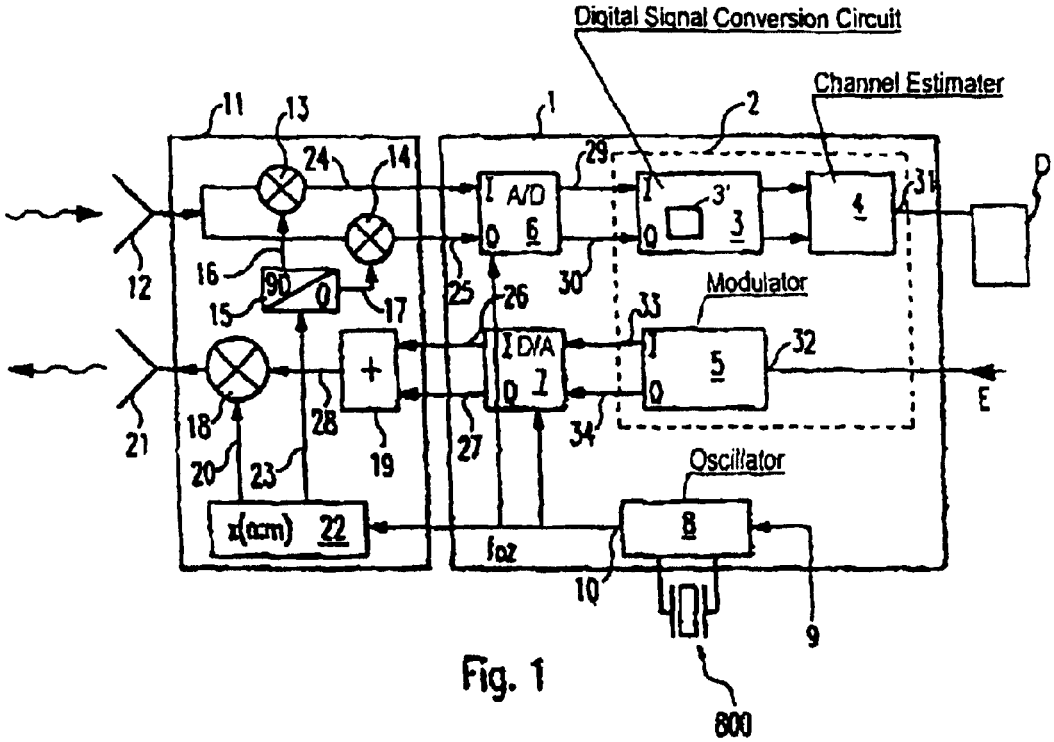
FIG. 1 is a block circuit diagram of a circuit configuration according to the invention.

In all the figures of the drawing, sub-features and integral parts that correspond to one another bear the same reference symbol in each case. Referring now to the figures of the drawing in detail and first, particularly, to FIG. 1 thereof, there is shown an integrated circuit (IC) 1 provided for a communication terminal, for example a mobile telephone. The IC 1 contains a data processing circuit 2, an A/D converter 6, a D/A converter 7 and an oscillator circuit (VCO: voltage controlled oscillator) 8.

The extent of the data processing circuit 2 is indicated by a dashed borderline in FIG. 1. The data processing circuit 2 contains a digital signal conversion circuit 3 with a digital filter 3' contained therein, a channel estimator 4 and a digital I/Q modulator 5. The data processing circuit 2 can exhibit, in a manner not shown, other digital circuit and control elements such as, for example, storage elements, microprocessors, micro-controllers, etc. and also other digital circuits such as, for example, a data detector D etc. which will still be mentioned in the text which follows.

An oscillator frequency $f_{oz}$ generated by the VCO 8 can be varied via a control input 9 of the VCO 8 and is provided at an oscillator output 10 of the VCO 8 as a system clock to the IC 1 and especially as a sampling frequency to the A/D converter 6 and the D/A converter 7.

The IC 1 operating in the low-frequency or baseband region is connected to a radio-frequency section 11 of a communication terminal.

At the receiving end, the radio-frequency section 11 can exhibit first and second down converters 13, 14 which accept a received signal provided by a receiving antenna 12. The down converters 13, 14 are operated with beat or mixed frequency signals 16, 17 which are phase-shifted by 90° with respect to one another and which are generated by a 90° phase shifter 15. In consequence, analog output received signals 24, 25 of the two down converters 13, 14 also exhibit a 90° phase shift (so-called in-phase I and quadrature Q branch). The analog output received signals 24, 25 are supplied to corresponding I and Q inputs of the A/D converter 6 which digitizes them independently of one another.

At the transmitting end of the radio-frequency section 11, analog I and Q output signals 26, 27, which are also phase-shifted by 90° and are output by the D/A converter 7 are superimposed on one another in an adding stage 19 of the radio-frequency section 11 and an output transmit signal 28 formed in an adding stage 19 is supplied as input signal to an up converter 18. The up converter 18 converts the output transmit signal 28, by mixing it with a beat or mixing frequency signal 20, into a transmit signal which is conducted to a transmitting antenna 21 (which, in practice, is identical to the receiving antenna 12) and is radiated by it.

In addition, the radio-frequency section 11 has an n:m frequency multiplier 22, the input of which is supplied with the oscillator frequency $f_{oz}$ and which generates both the beat frequency signal 20 for the up converter 18 and a beat or mixing frequency signal 23, which forms the basis of the down conversion, for the 90° phase shift 15. The latter signals 20, 23 are sinusoidal oscillations at a frequency f□(n/m)*$f_{oz}$, n and m being integral numbers which, as a rule, are different for the two signals 20, 23.

The radio-frequency section 11 can be implemented in many other ways than those shown here and, in addition, can also contain, for example, an intermediate-frequency stage and suitable bandpass filters for limiting the bandwidth.

In the text which follows, the operation of the circuit configuration described is explained in further detail and numbers quoted relate to the global system for mobile communication (GSM) standard used in digital mobile radio.

When a subscriber radio signal transmitted by a base station on one of the traffic channels reserved for this purpose (in a range from 935 to 960 MHz, 200 kHz channel bandwidth) is received, the two down converters 13, 14 are operated by the frequency multiplier 22, by selecting suitable values for n and m, in such a manner that the analog output received signals 24, 25 (I and Q branch) generated are in the low-frequency or baseband region. They can thus be sampled and digitized without problems by the A/D converter 6. The oscillator frequency used for the sampling can be, for example, $f_{oz}$=13 MHz.

Digital data signals 29 (I branch) and 30 (Q branch), generated by the A/D converter 6, are supplied to the signal conversion circuit 3.

The signal conversion circuit 3 produces, if necessary, a digital frequency shift for the digital data signals 29, 30 received, and subsequent digital filtering. The digital filtering provides the required bandwidth limiting (<200 kHz) of the transmission path at the receiving end. It can be implemented, for example, by a digital low-pass filter contained in the signal conversion circuit 3 (in the case of data signals 29, 30 in the baseband region) or a digital bandpass filter (in the case of data signals 29, 30 in the low-frequency region).

The signal conversion circuit 3 is followed by the channel estimator 4, the task of which consists of continuously (approximately every 0.5 ms) determining a current transfer function of the mobile radio channel by use of predetermined data sequences (so-called training sequences) which are regularly radiated by the base station and are known to the channel estimator 4. The transfer function characterizes the instantaneous transfer characteristic of the mobile radio channel. The continuous predetermination of the transfer function is necessary because the wave propagation in the air interface of the mobile radio channel continuously changes due to changing environmental influences (for example, shielding and reflection on buildings).

The transfer functions determined (estimated) and the filtered digital received data are applied to a data detector D, via an output 31 of the channel estimator 4. The detector D detects a digital data signal originally sent by using the transfer functions obtained. As a rule, further digital processing steps (demultiplexing, channel decoding, source decoding) follow which allow a complete reconstruction of the message sent. The configuration of the data processing circuit 2 depends to a great extent on the actual field of application of the communication terminal. For example, the channel estimator 4 can be omitted especially in the case of communication terminals which are connected by wire or optical fiber.

The operation at the transmitter end of the communication terminal is largely analogous to the operation at the receiver end described above.

The digital I/Q modulator 5 is supplied with a digital input signal E, which may first have been source-encoded, channel-encoded and multiplexed, via an input 32. The digital I/Q modulator 5 keys the digital input signal E using a predetermined modulation method, for example Gaussian minimum shift keying (GMSK) and, at the same time, limits the bandwidth. At the output end, the I/Q modulator 5 provides the D/A converter 7 with keyed (modulated) digital data signals 33, 34. The frequencies of the corresponding analog I and Q output signals 26, 27 are then converted in the up converter 18 in the manner already described.

A variation with time of the oscillator frequency $f_{oz}$ caused by frequency drift or frequency noise causes a corresponding change in the frequencies of the digital I and Q data signals 29, 30 (at the receiving end) and the radio wave radiated (at the transmitting end). This is based on the fact that the beat frequency signals 20, 23 supplied to the down and up converters 13, 14; 18 are derived from the oscillator frequency $f_{ox}$ and thus also contain its frequency instabilities. Such frequency changes occurring at the receiving and transmitting end are unwanted since they result in a mismatch of the signals to the filtering (at the receiving end) in the signal conversion circuit 3 and, respectively, to the traffic channel frequency assigned (at the transmitting end). In both cases, effective bandwidth losses occur and increased interchannel cross-talk may occur.

Frequency drifts of the oscillator frequency $f_{oz}$ are corrected via the control input 9 of the VCO 8. In the case of a mobile radio application, it can be performed, for example, during the frequency correction of the VCO 8, which is necessary in any case, for taking into consideration the Doppler frequency shift between transmitted and received radio waves. For this purpose, the base station radiates at regular time intervals (for example every 47 ms), a frequency correction burst (FCB) in the form of a sinusoidal oscillation. The FCB is searched for, in a manner not shown in greater detail, in the radio-frequency stage 11 with a frequency pattern (for example 20 kHz spacing). The frequency standard can be determined with the accuracy of the spacing by tuning to the pattern frequency having the maximum received FCB signal strength. The oscillator frequency $f_{oz}$ is then suitably corrected via a control voltage signal output by the radio-frequency section 11 and supplied to the control input 9 of the VCO 8.

The frequency noise of the VCO 8 is component-related and is mainly generated in a reference oscillator which can be considered to be the resonator of the VCO 8.

If maximum freedom from noise is required from the VCO 8, (expensive) hybrid components must be used for the VCO 8 or its reference oscillator. According to the invention, however, the entire VCO 8 is constructed integrally in the IC 1 with the exception of an oscillating crystal 800. As a result, a compromise between lower frequency noise and inexpensive construction is achieved which, in practice, is advantageous for a large number of applications.

Figure 2:
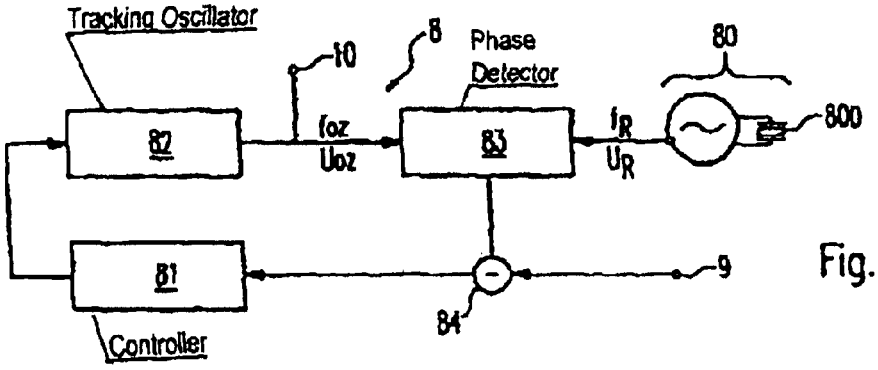
FIG. 2 is a block circuit diagram of a circuit of an oscillator circuit shown in FIG. 1.

FIG. 2 shows by way of example a circuit diagram of the VCO 8 which is here configured in the form of PLL control loop.

The VCO 8 exhibits the aforementioned reference oscillator 80, a controller 81, a tracking oscillator 82, a phase detector 83 and a comparison circuit 84. The comparison circuit 84 is supplied with an output voltage signal of the phase detector 83 and a control voltage signal present at the control input 9. From these two voltage signals, the comparison circuit 84 determines, for example by subtraction, a control error signal which is conducted to the controller 81. The controller 81 controls, depending on the control error signal, the voltage controlled oscillator 82 which then generates a voltage signal $U_{oz}$ with the oscillator frequency $f_{oz}$. The PLL control loop is closed by the phase detector 83 which determines the phase shift between a voltage signal $U_s$ at the frequency $f_s$, which is accepted by the reference oscillator 80, and the voltage signal $U_{oz}$ of the oscillator frequency $f_{oz}$, and returns this as an output voltage signal to the comparison circuit 84 as described.

Figure 3:
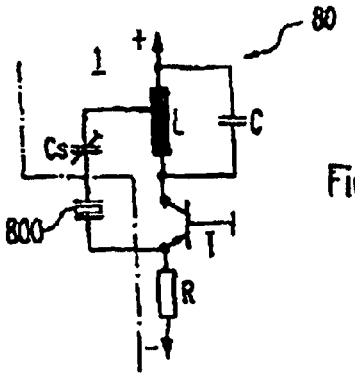
FIG. 3 is a circuit diagram of a reference oscillator shown in FIG. 2.

FIG. 3 shows a circuit diagram of the reference oscillator 80. The circuit configuration of the reference oscillator 80 is known and is called a "Hartley Oscillator" in the art. It has an inductance L and a capacitor C which is connected in parallel with the inductance L. An oscillating crystal 800 connected in a positive feedback circuit to a transistor T is used as the resonator 800. An adjustable capacitor $C_s$ is connected in series with the oscillating crystal 800 and a resistor R is connected to a transistor T. According to the line drawn dot-dashed etc., and representing the extent of IC 1, the inductance L, the transistor T, the adjustable capacitor $C_s$ and the resistor R are constructed integrally in IC 1, where the oscillating crystal 800 is not an integral element of IC 1.

We claim:

1. A transceiver configuration for a communication terminal, comprising:

an A/D converter outputting a first digital data signal;

a D/A converter;

a controllable oscillator circuit connected to said A/D converter and to said D/A converter, said controllable oscillator circuit having a reference oscillator with an oscillating crystal as a resonator and outputs a sampling clock received by said A/D converter and said D/A converter;

a digital data processing circuit connected to said A/D converter and to said D/A converter and receives the first digital data signal output by said A/D converter and processes it further and outputs a second digital data signal to said D/A converter;

said A/D converter, said D/A converter, said data processing circuit and said controllable oscillator circuit, apart from said oscillating crystal of said reference oscillator, being constructed as a monolithically integrated circuit so that of said controllable oscillator circuit, only said oscillating crystal is implemented as an external component; and a frequency section being at least one of a radio-frequency section and an intermediate-frequency section connected to said A/D converter, to said D/A converter and to said controllable oscillator circuit, said frequency section having a frequency converter stage operating with a beat frequency derived from said controllable oscillator circuit.

2. The transceiver configuration according to claim 1, wherein said digital data processing circuit has a digital filter and a digital modulator.

3. The transceiver configuration according to claim 1, wherein said digital data processing circuit has a channel estimator.

4. The transceiver configuration according to claim 3, including a data detector connected to said channel estimator.

*5. A transceiver configuration, comprising:*

*an A/D converter;*

*a D/A converter;*

*an oscillator circuit configured to provide a sampling clock that is received by the A/D converter and the D/A converter;*

*a digital data processing circuit that receives a first digital data signal from the A/D converter and provides a second digital data signal to the D/A converter; and*

*a frequency section coupled to the A/D converter and the D/A converter, wherein the frequency section comprises a frequency converter stage that operates with a beat frequency derived from the sampling clock.*

*6. The transceiver of claim 5, wherein the reference oscillator comprises an oscillating crystal.*

*7. The transceiver of claim 6, wherein the A/D converter, the D/A converter and the oscillator circuit, apart from the oscillating crystal, are constructed as a monolithic integrated circuit.*

*8. A transceiver, comprising:*

*an A/D converter;*

*a D/A converter;*

*an oscillator circuit configured to provide a clock signal to the A/D converter and the D/A converter, wherein the clock signal is corrected by comparing a control input signal to a phase difference between a reference oscillator signal frequency and a clock signal frequency; and*

*a frequency section configured to communicate with the A/D converter and the D/A converter and operate at a frequency derived from the clock signal, wherein the frequency section provides the control input signal to the oscillator circuit.*

*9. The transceiver of claim 8, wherein the control input signal is derived from a frequency correction burst signal that is received by the frequency section.*

*10. The transceiver of claim 8, wherein the oscillator circuit comprises an oscillating crystal.*

*11. The transceiver of claim 10, wherein the D/A converter, the D/A converter and the oscillator circuit, apart from the oscillating crystal, are constructed as a monolithic integrated circuit, and wherein the oscillating crystal is implemented as an external component.*

*12. A receiver, comprising:*

*an A/D converter;*

*an oscillator circuit configured to provide a sampling clock that is received by the A/D converter;*

*a digital data processing circuit configured to receive a digital data signal from the A/D converter; and*

*a frequency section coupled to the A/D converter, wherein the frequency section comprises a frequency converter stage that operates with a beat frequency derived from the sampling clock.*

*13. The receiver of claim 12, wherein the oscillator circuit comprises an oscillating crystal.*

*14. The receiver of claim 13, wherein the A/D converter and the oscillator circuit, apart from the oscillating crystal, are constructed as a monolithic integrated circuit.*

*15. A transmitter, comprising:*

*a D/A converter;*

*an oscillator circuit configured to provide a sampling clock that is received by the D/A converter;*

*a digital data processing circuit that provides a digital data signal to the D/A converter; and*

*a frequency section coupled to the D/A converter, wherein the frequency section comprises a frequency converter stage that operates with a beat frequency derived from the sampling clock.*

*16. The transmitter of claim 15, wherein the oscillator circuit comprises an oscillating crystal.*

*17. The transmitter of claim 16, wherein the D/A converter and the oscillator circuit, apart from the oscillating crystal, are constructed as a monolithic integrated circuit.*

*18. The transmitter of claim 15, wherein the oscillator circuit is configured to correct the sampling clock by comparing a control input signal to a phase difference between a reference oscillator signal frequency and a sampling clock frequency.*

*19. The transmitter of claim 18, wherein the control input signal is derived from a frequency correction burst signal that is received by the frequency section.*

*20. A method of operating a receiver; comprising;*

*correcting a clock signal by comparing a control input signal to a phase difference between a reference oscillator signal frequency that is derived from a crystal oscillator and a frequency of the clock signal;*

*converting a received signal into an analog signal using a beat frequency derived from the clock signal; and*

*converting the analog signal into a digital data signal using the frequency of the clock signal as a sampling frequency.*

*21. The method of claim 20, wherein comparing the control input signal to the phase difference comprises subtracting either the control input signal from the phase difference or the phase difference from the control input signal.*

*22. The method of claim 20, further comprising:*

*receiving a frequency correction signal; and*

*converting the frequency correction signal into the control input signal.*

*23. A method of operating a transmitter, comprising:*

*correcting a clock signal by comparing a control input signal to a phase difference between a reference oscillator signal frequency that is derived from a crystal oscillator and a frequency of the clock signal;*

*converting a digital data signal into an analog signal using the frequency of the clock signal as a sampling frequency; and*

*converting the analog signal into a transmit signal using a beat frequency derived from the clock signal.*

*24. The method of claim 23, wherein comparing the control input signal to the phase difference comprises subtracting either the control input signal from the phase difference or the phase difference from the control input signal.*

*25. The method of claim 23, further comprising:*

*receiving a frequency correction signal; and*

*converting the frequency correction signal into the control input signal.*

*26. A method of operating a transceiver, comprising:*

*correcting a clock signal by determining a phase difference between a reference oscillator signal frequency that is derived from a crystal oscillator and a frequency of the clock signal;*

*converting a received signal into a first analog signal using a beat frequency derived from the clock signal;*

*converting the first analog signal into a first digital data signal using the frequency of the clock signal as a sampling frequency;*

*converting a second digital data signal into a second analog signal using the frequency of the clock signal as the sampling frequency; and*

*converting the second analog signal into a transmit signal using the beat frequency that is derived from the clock signal.*

*27. The method of claim 26, further comprising:*

*determining a control error by comparing a control input signal to the phase difference; and*

*adjusting the frequency of the clock signal based on the control error.*

*28. The method of claim 27, wherein comparing the control input signal to the phase difference comprises subtracting either the control input signal from the phase difference or the phase difference from the control input signal.*

*29. The method of claim 27, further comprising:*

*receiving a frequency correction signal; and*

*converting the frequency correction signal into the control input signal.*

* * * * *